US009116700B2

(12) United States Patent
Chinnakkonda Vidyapoornachary et al.

(10) Patent No.: US 9,116,700 B2
(45) Date of Patent: *Aug. 25, 2015

(54) COMPUTER MEMORY POWER MANAGEMENT

(71) Applicant: International Business Machines Corporation, Armonk, NY (US)

(72) Inventors: Diyanesh B. Chinnakkonda Vidyapoornachary, Bangalore (IN); Marc A. Gollub, Round Rock, TX (US); Joab D. Henderson, Pflugerville, TX (US)

(73) Assignee: International Business Machines Corporation, Armonk, NY (US)

(*) Notice: Subject to any disclaimer, the term of this patent is extended or adjusted under 35 U.S.C. 154(b) by 0 days.

This patent is subject to a terminal disclaimer.

(21) Appl. No.: 14/247,308

(22) Filed: Apr. 8, 2014

(65) Prior Publication Data

US 2015/0143199 A1 May 21, 2015

Related U.S. Application Data

(63) Continuation of application No. 14/086,247, filed on Nov. 21, 2013.

(51) Int. Cl.
*G11C 29/00* (2006.01)
*G06F 1/32* (2006.01)
*G06F 11/10* (2006.01)

(52) U.S. Cl.
CPC .......... *G06F 1/3275* (2013.01); *G06F 11/106* (2013.01)

(58) Field of Classification Search
CPC ............ G06F 11/1044; G06F 11/1008; G06F 11/1076; G06F 12/0246; G06F 11/167; G06F 11/1048; G06F 1/3275; G06F 2212/1028; G11C 11/406; G11C 11/40618; G11C 11/40622; G11C 29/52; G11C 2211/4062; G11C 2211/4067; G11C 2029/0411; Y02B 60/1225
See application file for complete search history.

(56) References Cited

U.S. PATENT DOCUMENTS

| | | | |
|---|---|---|---|
| 7,275,130 B2 | 9/2007 | Klein | |
| 8,271,932 B2 | 9/2012 | Bair et al. | |
| 2004/0027880 A1* | 2/2004 | Tanishima et al. | 365/200 |
| 2008/0259669 A1* | 10/2008 | Choi | 365/51 |
| 2010/0115376 A1* | 5/2010 | Shalvi et al. | 714/763 |
| 2011/0320918 A1 | 12/2011 | Alves et al. | |
| 2012/0173936 A1 | 7/2012 | Johnson et al. | |
| 2012/0198309 A1 | 8/2012 | Alves et al. | |

(Continued)

OTHER PUBLICATIONS

Chinnakkonda Vidyapoornachary et al., "Computer Memory Power Management," U.S. Appl. No. 14/086,247, filed Nov. 21, 2013.

*Primary Examiner* — Guerrier Merant
(74) *Attorney, Agent, or Firm* — Penny L. Lowry; Robert Williams

(57) ABSTRACT

A method of operating a computer memory system with ECC features that will enable operational modes with less electrical power consumption. A chip mark normally used to mark a failing DRAM device may instead be used to mark a non-failing DRAM device before a computer memory system shuts off electrical power to the marked non-failing DRAM device to reduce power consumption, putting the rank of memory that contains the DRAM device in a low power consumption mode. Upon a request from the computer memory system, the chip mark may be removed from the marked non-failing DRAM device in order to return the non-failing DRAM device to normal operation.

6 Claims, 7 Drawing Sheets

(56) References Cited

U.S. PATENT DOCUMENTS

| | | |
|---|---|---|
| 2013/0007542 A1 | 1/2013 | Carman et al. |
| 2013/0212431 A1* | 8/2013 | Ong .................................. 714/15 |
| 2014/0068318 A1* | 3/2014 | Oikawa .......................... 714/6.1 |
| 2014/0119131 A1* | 5/2014 | Verma et al. ............. 365/189.02 |

* cited by examiner

COMPUTER MEMORY POWER MANAGEMENT

TECHNICAL FIELD

The present disclosure relates to methods of operating computer systems with error correcting features. In particular, the present disclosure relates to computer memory systems, dynamic random access memory (DRAM) modules, and managing power consumption during computer operation.

BACKGROUND

Computer systems may use dynamic random access memory (DRAM) modules to store data being used to operate the computer system or being used for computation by programs running on the computer system. Some computer systems contain error checking code (ECC) features in the computer memory systems that allow correction of data errors in the computer memory system.

DRAM devices in computer memory systems require a constant supply of electrical power in order to read, write, and preserve the data stored therein. In some computer systems, the power consumption of DRAM devices in the computer memory system may constitute as much as 10% of the total computer system power consumption. Computer systems that do not have ECC features may perform computational tasks equivalent to computer systems that have ECC features at a lower expenditure of electrical power.

SUMMARY

A method of regulating computer memory in a computer memory subsystem, the method comprising selecting a first rank in the computer memory subsystem with ECC decoder features that operate with per-rank granularity, the EC decoder configured to correct in DRAM devices associated with a chip mark, the chip mark associated with failing DRAM devices; associating the chip mark with at least one non-failing DRAM device in the first rank; and placing the at least one non-failing DRAM device associated with the chip mark in a low power mode.

DETAILED DESCRIPTION

Figure 1:
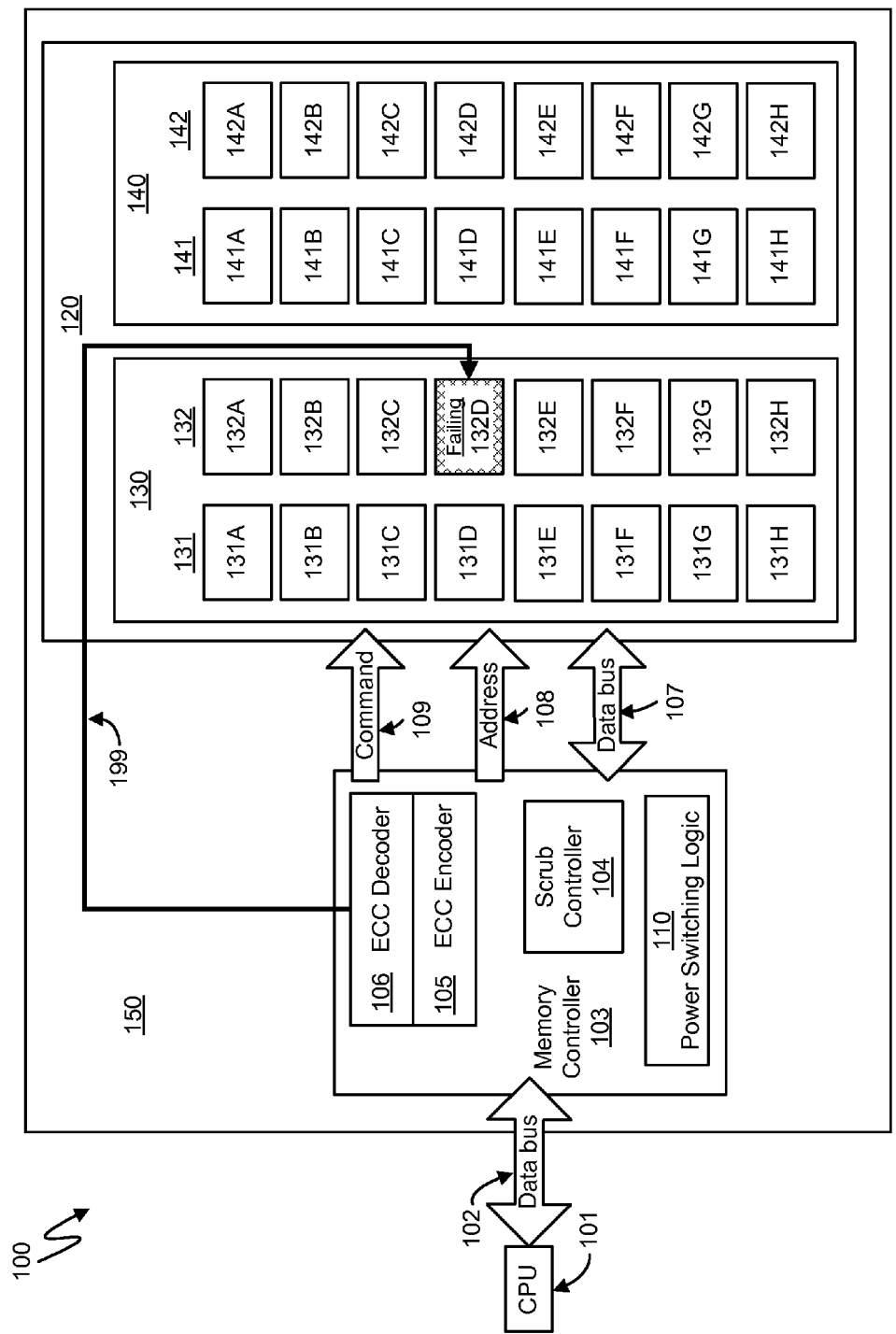
FIG. 1 shows a schematic diagram of a computer memory system with ECC features having a chip mark applied to a DRAM device, according to an embodiment.

Computing devices may use storage media to archive, hold, and queue information into or out from a central processing unit during computer operations. Among other properties, types of storage media can be distinguished from each other by their data retention characteristics and the latency of data retrieval from a storage medium. Data stored on a hard drive or solid state drive (SSD) may be accessed and transferred at a relatively slow rate for subsequent holding in a DRAM device in a computer memory system. A central processing unit (CPU) may then access the data stored in the DRAM device at a relatively fast rate in order to improve overall computer operation characteristics. Data in DRAM devices is volatile; when electrical power to the DRAM device is cut off, the data stored therein quickly decays and becomes unrecoverable. Data in DRAM devices may also become corrupted or unrecoverable through electrical fluctuations in a DRAM device, by capacitor breakdown in the DRAM device, or even radiation exposure, among other causes.

While many computing applications can tolerate the occurrence of unrecoverable computer memory errors, some types of computer applications (e.g., financial transaction management, high performance computing and modeling) may require both high system availability and highly accurate data because small changes in the data being handled can have measurable deleterious effects on the outcomes of the calculations being performed. In response to this need, computer manufacturers have developed and deployed a variety of error correcting code (ECC) schemes and features that allow a computer memory system to identify and to correct some data errors in computer memory systems.

Computer memory systems with ECC features may include components such as memory controllers, ECC encoders, ECC decoders, addressing logic, control logic, I/O busses and data busses in addition to ranks of DRAM devices in DIMMs (dual inline memory modules) or other types of memory modules or computer memory subsystems. When data is written to a DRAM device in a computer memory subsystem, the ECC system may generate and record corrective information into the computer memory along with the original data. During mainline computer operation, any data errors that occur in this stored data may be corrected with the ECC corrective information in order to preserve the integrity of the original data. ECC systems may be adjusted to correct for one or more computer memory errors during computer system operation, depending on the number of ECC corrective bits that are associated with the data to be corrected.

Data correction may correct data errors caused by both soft (i.e., non-hardware) and hard (i.e., hardware-related) types of errors. Device-related memory errors may occur when a DRAM capacitor cell begins to break down and a bit of data, represented by electrical charge stored in the capacitor, "flips" as the charge leaks out of the capacitor before the data can be read and refreshed. Soft memory errors may occur either by unexpected discharge, or by radiation or cosmic ray exposure that flips the bit state of a DRAM cell. Soft errors may be singular events that will not repeat in a particular DRAM device memory location, while hard memory errors may tend to recur in particular DRAM device memory locations because the device itself is degrading in some manner. ECC features contribute to the reliability and serviceability (RAS) of a computer system by reducing downtime and insuring data reliability. Whether computer memory errors are singular or repeating occurrences, ECC features may help to identify memory errors and may help to correct or circumvent them.

Some computer memory ECC systems may contain the ECC feature of chip mark capability. When a DRAM device experiences a memory error, the memory controller may use an ECC decoder to read and to interpret ECC corrective information in order to perform a repair process on the memory error. When a soft error occurs, the memory controller may identify and correct the memory error while a DRAM device remains in an operational state. When a hard error occurs, the memory controller may apply a chip mark to the effected DRAM device. The chip mark may instruct a computer system memory controller to ignore ECC warnings and ECC data from a DRAM device that experiences an unrecoverable computer memory error. An effected DRAM device may be ignored or bypassed in future data processing to ensure data integrity while keeping the remainder of a rank of computer memory in an operational state, using the remaining stored ECC corrective bits to correct other computer memory errors. When a chip mark is applied to a DRAM device, however, the computer memory may have lessened capacity to correct computer memory errors in the rank where the DRAM device is located. Future computer memory errors may be unrecoverable with some implementations of ECC. Some embodiments of computer memory systems may employ a first chip mark to mark a failing memory array that has experienced a data error as well as a second chip mark that is used to enable turning off electrical power to a non-failing memory array. Non-failing memory arrays may contain correct data, or may contain no data after valid data has been copied to other memory arrays in the process of switching from a normal power mode to a low power mode.

Because computer systems, especially high performance computer systems, employ ever-greater amounts of memory in order to handle more data and to perform calculations more quickly, computer power consumption has become an increasingly important aspect of designing and operating computer systems. DRAM requires a continuous supply of electrical power in order to access and to preserve the data stored in it. Consequently, DRAM devices may account for a significant and growing share of the total power consumption of a computer system, even as other parts such as CPUs become more energy efficient. However, as the problem of power consumption becomes more acute, new methods of regulating and reducing power consumption by a computer memory system may provide measurable and significant efficiency improvements in computer systems.

Some embodiments of computer memory systems may use the chip mark feature of a computer memory system with ECC features to regulate power consumption by the computer memory system rather than to ensure data accuracy in DRAM devices. A chip mark may be applied to a non-failing DRAM device in a rank of a computer memory subsystem and the marked DRAM device may be turned off to reduce the total power consumption of the computer memory subsystem. Permutations of marking and powering down DRAM devices in computer memory subsystems may have the effect of finely regulating the power consumption of the computer memory without adversely affecting computer system performance.

In some embodiments of computer memory systems, at least three modes of operating a computer memory system may be envisioned: first, a fully RAS optimized (or mainline) operation; second, a fully power-optimized operation; and third, a mixed mode operation. Operating a computer memory system in a fully RAS optimized mode may occur when all the DRAM devices in a computer memory system are operating in a powered-on state with ECC features enabled to protect data accuracy on all chips. The fully RAS optimized mode may consume the most power of any of the three modes of presented for computer memory systems that possess chip mark capability.

The second operational mode, fully power-optimized operation, may occur when a chip mark is applied to at least one non-failing (i.e., fully functional) DRAM device in every rank of a computer memory system, and the marked DRAM devices may be turned off to reduce electrical power consumption. The total number of DRAM devices in a rank of computer memory that may receive a chip mark may depend on the particular ECC configuration and number of ECC corrective bits implemented in the computer system. The chip-marked DRAM devices may consume no power until the chips have been taken out of low power operation mode, the chips have been scrubbed with a read-write-modify scrub to put the DRAM device in a known data state, the chip marks on them have been removed and they are returned to mainline operation. The ECC features of the computer memory system, with the exception of chip mark capability, may still be available to correct computer memory errors in other portions of the computer memory. A power saving instruction may be transmitted from a central processing unit to a memory controller, or from a power switching logic contained in a memory controller to the ECC decoder, in order to trigger the placement of a chip mark for power saving purposes on a non-failing memory array in a DRAM device or other form of computer memory.

The third operational mode, mixed mode operation, may include applying a chip mark to at least one non-failing (i.e., fully functional) DRAM device in at least one rank of DRAM devices. As with the second mode, a central processing unit may transmit the power saving instruction to the memory controller, or to the power switching logic in the memory controller, that will trigger the placement of a chip mark on a non-failing memory array. The memory controller, in order to switch between a low power mode and a normal power mode, may transmit a power saving instruction and memory register set data that may instruct a controller in a computer memory whether to operate in a normal mode or whether to operate in a low power mode.

The number of ranks having marked DRAM devices may be between one and one less than the full number of ranks of DRAM devices in the computer system. In mixed mode operation, at least one chip mark is applied to a non-failing (i.e., functional) DRAM device on each selected rank of computer memory and the marked DRAM devices are powered off. ECC functionality for the selected ranks may still be enabled while the selected ranks are operating in low power mode just as ECC continues to function on ranks for which no non-failing DRAM device has been marked by a chip mark. Thus, a computer system may reduce the total power consumed during computer operation.

In an alternative method of accomplishing mixed mode operation, a computer system may contain different kinds of ECC-capable DIMMs: some DIMMs may contain a full complement of DRAM devices and enjoy the full benefit of ECC features implemented in a computer system, including the use of chip mark capability to indicate failing components; while a second type of DIMM may contain less than a full complement of DRAM devices but still enjoy all the ECC functionality present in the system except the chip mark capability. The second type of DIMM, an underpopulated DIMM, will receive a chip mark at each location for a DRAM device that is unpopulated (i.e., no DRAM device has been installed in the circuit at the location). Error correction may still occur, but there may be less redundancy. In a computer memory system that contains both types of DIMMs, the fully-populated DIMMs may switch between a fully-RAS optimized mode and a low power mode of operation, whereas an underpopulated DIMM may only operate in low power mode.

Operational modes may otherwise be enabled and disabled at the discretion of the computer system in a manner reminiscent of adjusting CPU performance and power consumption. When a DRAM device switches from a powered-off state to a powered-on state, the memory controller and scrubbing controller may perform a scrub of a DRAM device in order to set the cells in the device to a known state before beginning mainline operation. Scrubbing of a DRAM device may also occur when a DRAM device contains data that is not actively being used by a CPU but that still needs to be retained in the computer memory system. The memory controller and scrubbing controller will work to read data in blocks of the DRAM device, verify that data with the ECC corrective information stored in the computer memory subsystem, and subsequently rewrite the data to the DRAM device until a subsequent scrub cycle occurs or until the data is actively used by a CPU and is actively read and written during mainline operation of the DRAM device.

The figures described hereinafter demonstrate features and behavior of embodiments of the present invention but are not intended to demonstrate restrictions in alternative methods of applying or embodying the features of the current invention.

FIG. 1 portrays a computer system 100 operated in a fully RAS-optimized mode. The computer system 100 contains a central processing unit 101, a computer memory system 150, and a first data bus 102 that interconnects them. The computer memory system 150 contains a memory controller 103. The memory controller 103 may contain a scrubbing controller 104, an ECC encoder 105, an ECC decoder 106, and a power switching logic 110. The memory controller 103 is electrically connected to a computer memory subsystem 120 via a second data bus 107, an address control channel 108 and a command control channel 109. The power switching logic 110 may be configured to receive a power saving instruction from a central processing unit, and may be configured to send memory register set data to a computer memory that may process the memory register set data to transfer between low power mode and normal power mode. The computer memory subsystem 120 may contain two dual inline memory modules (DIMMs) 130 and 140. DIMMs 130 and 140, in this embodiment, may each contain two ranks, 131 and 132 and 141 and 142 respectively, of DRAM devices (e.g., 131A through 131H). In other embodiments the DIMM may contain more or fewer ranks depending on the desired configuration of the computer memory subsystem 120. A rank 131 of computer memory contains DRAM devices 131A through 131H that are used for active computation and for storage of ECC corrective information.

When the computer system is operated in fully RAS-optimized mode, ECC may operate with per-rank granularity, where each rank of DRAM devices has an independent ECC capability. When, as portrayed in this embodiment, DRAM device 132D experiences a memory error, ECC decoder 106 in memory controller 103 may read ECC corrective information to correct the memory error and continue mainline operation. If failing DRAM device 132D experiences an unrecoverable memory error, such as a DRAM failure, memory controller 103 may place a chip mark 199 on failing DRAM device 132D to signal to the computer memory subsystem 150 that: first, failing DRAM device 132D is unreliable and ECC warnings from DRAM device 132D may be ignored, and second, failing DRAM device 132D may be bypassed during mainline operation of computer memory subsystem 120.

Figure 2:
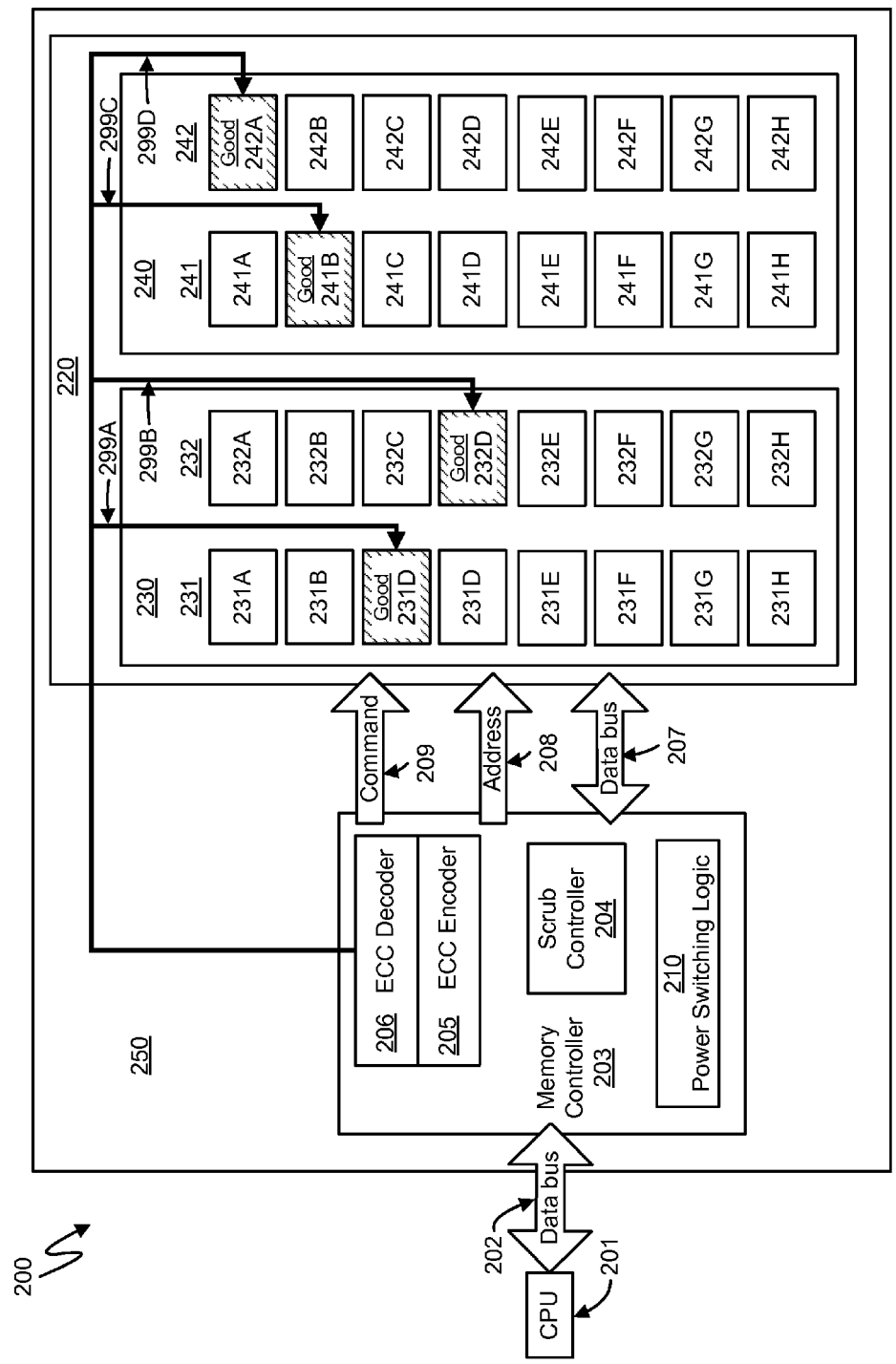
FIG. 2 shows a schematic diagram of a computer memory system with ECC features operating in a low power mode, where a chip mark is applied to one DRAM device in every rank of computer memory, according to an embodiment.

FIG. 2 portrays an embodiment where a computer system 200 is operated with portions of a computer memory subsystem 220 in a fully power-optimized mode. In computer system 200, central processing unit (CPU) 201 is electrically connected to memory controller 203 in computer memory system 250 by a first data bus 202. Memory controller 203 contains a power switching logic 210, a scrubbing controller 204, an ECC encoder 205, and an ECC decoder 206. The memory controller 203, scrubbing controller 204, and the ECC encoder 205 and ECC decoder 206 communicate electrically with computer memory subsystem 220 via data bus 207, address channel 208, and command channel 209. The power switching logic 210 may be configured to receive a power saving command from the central processing unit, and to transmit instructions to a command logic in a computer memory that will initiate the transition between low power mode and normal power mode. Computer memory subsystem 220 contains memory modules 230 and 240 that further contain two ranks, 231 and 232 and 241 and 242 respectively, of DRAM devices 231A-242H respectively.

Computer memory system 250 may operate in a fully power-optimized mode by sending a command from the memory controller 203 to apply multiple chip marks 299A, 299B, 299C and 299D to multiple good DRAM devices 231C, 232D, 241B and 242A to disable responses to ECC warnings from these DRAM devices. Memory controller 203 may than disable electrical power to the multiple good DRAM devices 231C, 232D, 241B and 242A while the remaining good DRAM devices operate normally. Memory controller 203 may subsequently enable electrical power to the multiple good DRAM devices 231C, 232D, 241B and 242A and perform a read-write-modify scrub on the multiple good DRAM devices before lifting chip marks 299A, 299B, 299C and 299D and enabling fully RAS-optimized mode in the computer memory system.

Figure 3:
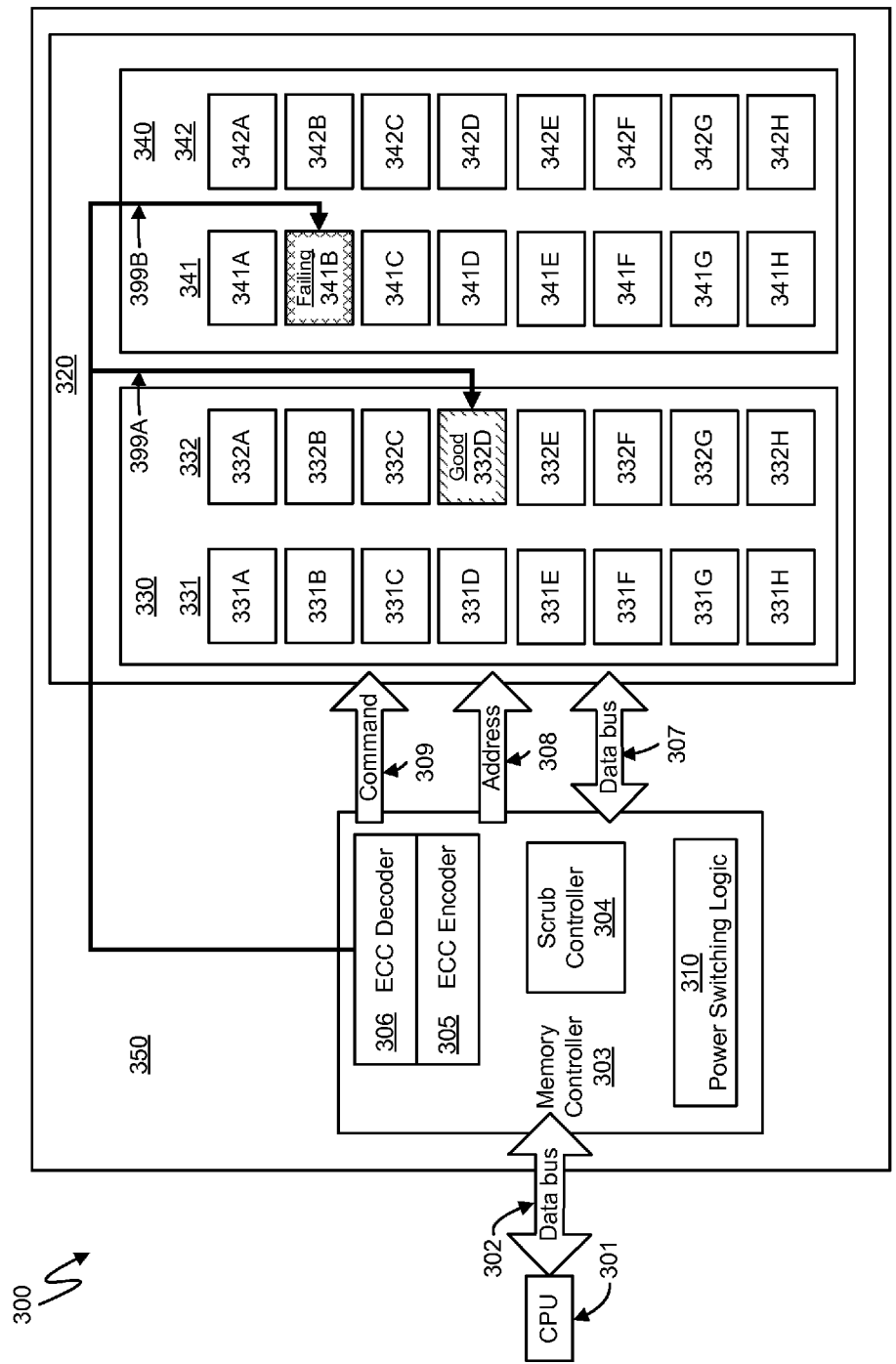
FIG. 3 shows a schematic diagram of a computer memory system with ECC features operating in mixed power consumption mode, where one DRAM device in some ranks of computer memory have received a chip mark, while other ranks of computer memory have no DRAM devices with a chip mark applied, according to an embodiment.

FIG. 3 is representative of embodiments where computer system 300 is being operated in the mixed power consumption mode. FIG. 3 may represent a state of the computer memory system during a transition from power-optimized mode to fully RAS-optimized mode. Computer system 300 contains a central processing unit (CPU) 301 connected to a computer memory system 350 by a first data bus 302. Computer memory system 350 contains memory controller 303 and computer memory subsystem 320. Memory controller 303 further contains power switching logic 310, scrubbing controller 304, ECC encoder 305, and ECC decoder 306. Memory controller 303 is electrically connected to computer memory subsystem 320 by a second data bus 307, an address channel 308 and a command channel 309. In the example embodiment of computer system 300, computer memory subsystem 320 contains two dual inline memory modules (DIMMs) 330 and 340. DIMM 330 contains two ranks 331 and 332 of DRAM devices 331A-332S that constitute part of the computer memory. Each rank contains computation DRAM devices 331A-331H. Some embodiments may contain more or fewer DRAM devices than specifically portrayed herein.

In this embodiment, computer memory system 350 is operating in a mixed power mode, where power switching logic 310 has received a power saving instruction from the central processing unit 301. Power switching logic 310 has subsequently instructed ECC decoder 306 to apply chip marks 399A and 399B to DRAM devices 332D and 341B in ranks 332 and 341. Ranks 331 and 342 are operating in a fully RAS-optimized mode, where no chip marks have been applied to any DRAM devices in the ranks 331 and 342. Chip mark 399A has been applied to a non-failing good DRAM device 332D which has been powered off for power consumption purposes and which may subsequently be turned back on to return rank 332 to operate rank 332 in fully RAS-optimized mode. Chip mark 399B has been applied to failing DRAM device 341B, which has experienced an unrecoverable memory error. Accordingly, electrical power to failing DRAM device 341B may be cut off to provide some reduction in power consumption by computer memory system 350.

When returning rank 332 from fully power-optimized mode to fully RAS-optimized mode, memory controller 303 may begin to provide electrical power to good DRAM device 332D while chip mark 399A is still applied, perform a read-write-modify scrub on good DRAM device 332D, and remove chip mark 399A. During a scrub, capacitor cells are sequentially read (i.e., the voltage state of the capacitor cell will be measured) and written (i.e., a known voltage will be applied to a capacitor cell) in order to verify that a DRAM device is in a known condition.

Figure 4:
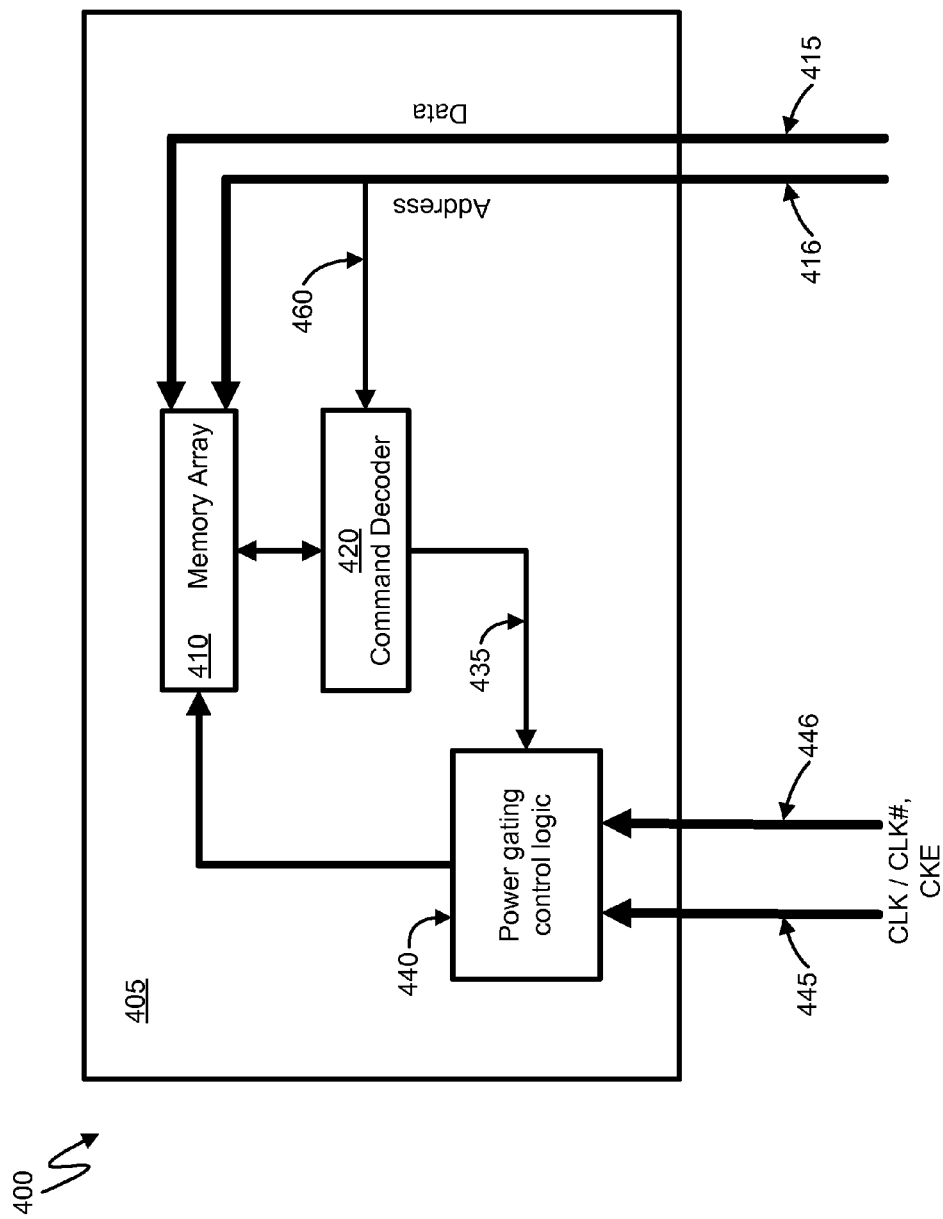
FIG. 4 outlines a control system for putting a computer memory system into mixed power consumption mode, according to an embodiment.

FIG. 4 shows a schematic diagram of embodiments of a computer memory 405 that contains a memory array 410, a command decoder 420, and a power gating control logic 440. The memory array 410 is connected to the command decoder 420, the command decoder is connected to the power gating control logic 440, and the power gating control logic is connected to the memory array 410. The command decoder 420 is configured to receive memory register set data via a connection to the address line 416 into the computer memory 405. The memory array 410 is configured to accept input from the address line 416 and the data line 415. The power gating control logic is configured to receive clock timing signals 445 and clock enable or disable signals 446. When a computer memory 405 receives memory register set data, the command decoder 420 interprets the memory register set data and responds by instructing the power gating control logic to turn on or turn off the electrical power to the memory array, or alternatively to continue or to discontinue the data refresh cycle in the computer memory array. A computer memory array may receive memory register set data in response to the placement of a chip mark on the memory array, as when a data error has occurred, or as when the power switching logic has received an instruction to transition from a normal power mode to a low power mode.

During mixed mode operation of a computer memory subsystem, DRAM 400 may receive a command via the address channel 416 to apply a chip mark on memory array 410. Command decoder 420 may then transmit information regarding the chip mark to logic element 430 that may subsequently transmit a control signal to power gating control logic element 440 to shut off power supply to part of memory array 410. Memory array 410 may contain one or more DRAM devices. Upon receipt of an appropriate signal from a memory controller via address channel 416 to command decoder 420, a computer memory system may disable mixed mode operation by triggering command decoder 420 to, firstly, trigger logic element 430 to enable power gating control logic 440 to provide power to all or part of memory array 410, after which command decoder 420 may perform a memory scrub of all or part of memory array 410 before removing or disabling the chip mark from part of memory array 410. This embodiment is not intended to represent or imply the sole process by which the present invention may be enabled. Rather, all possible process of accomplishing mixed mode operation are claimed herein, including gating clock signals from the memory controller or enabling low power mode (without data retention) as envisioned in DDR4 (double data rate 4th generation DRAM) memory specifications.

Figure 5:
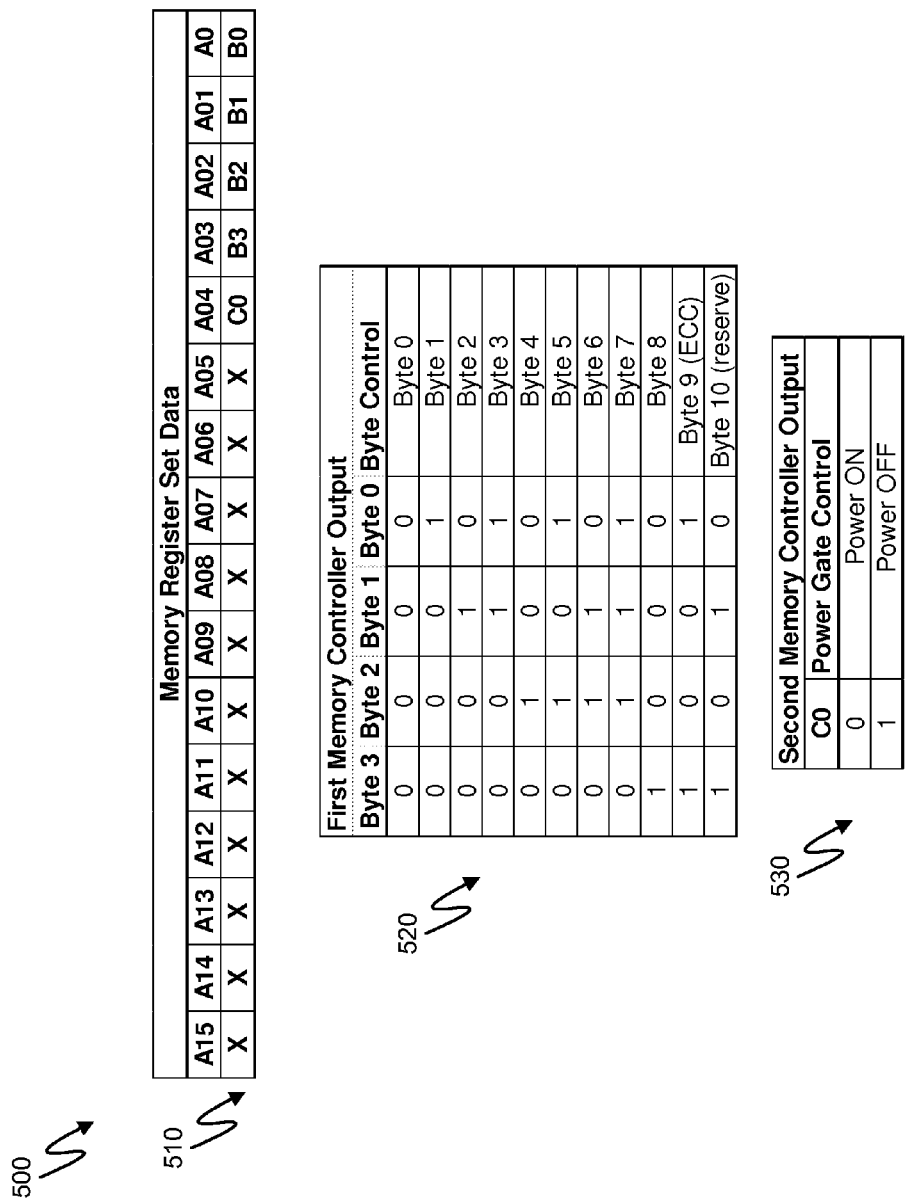
FIG. 5 shows a series of control sequences for transmitting DRAM device location information and power status to DRAM devices entering or exiting mixed power consumption mode, according to an embodiment.

FIG. 5 shows an embodiment of a possible of command format 500 that may be used to control the function of elements in a computer memory system. The Memory Register Set Data 510 may contain a number of command fields or command bits A0 through A15. A subset of these command bits, such as A0 through A3 may be used to contain a First Memory Controller Output 520 that can be used to identify a single DRAM device within a rank of memory. A further command bit, such as A4, may be used to contain a Second Memory Controller Output 530 that may control the function of a power gate control within a DRAM device. The remaining command bits in the Memory Register Set Data 510 may be used for other specified purposes, such as identifying a single rank or memory, or adjusting timing or read, write, or scrub functions, or other functions in a DRAM device. The number of byte word identifiers shown in First Memory Controller Output 520 is only a representative sample; other formats may be used, as may be marks of different lengths that also enable the present invention in a computer memory system. Finally, Second Memory Controller Output 530 demonstrates one possible set of command bits that may control the power consumption status of any DRAM device in a computer memory system, whether on or off, although other possible command bit structures are possible. When Memory Register Set Data 510 is transmitted to a computer memory subsystem, the computer memory system may place chip marks on individual DRAM devices and power DRAM devices on or off.

Figure 6:
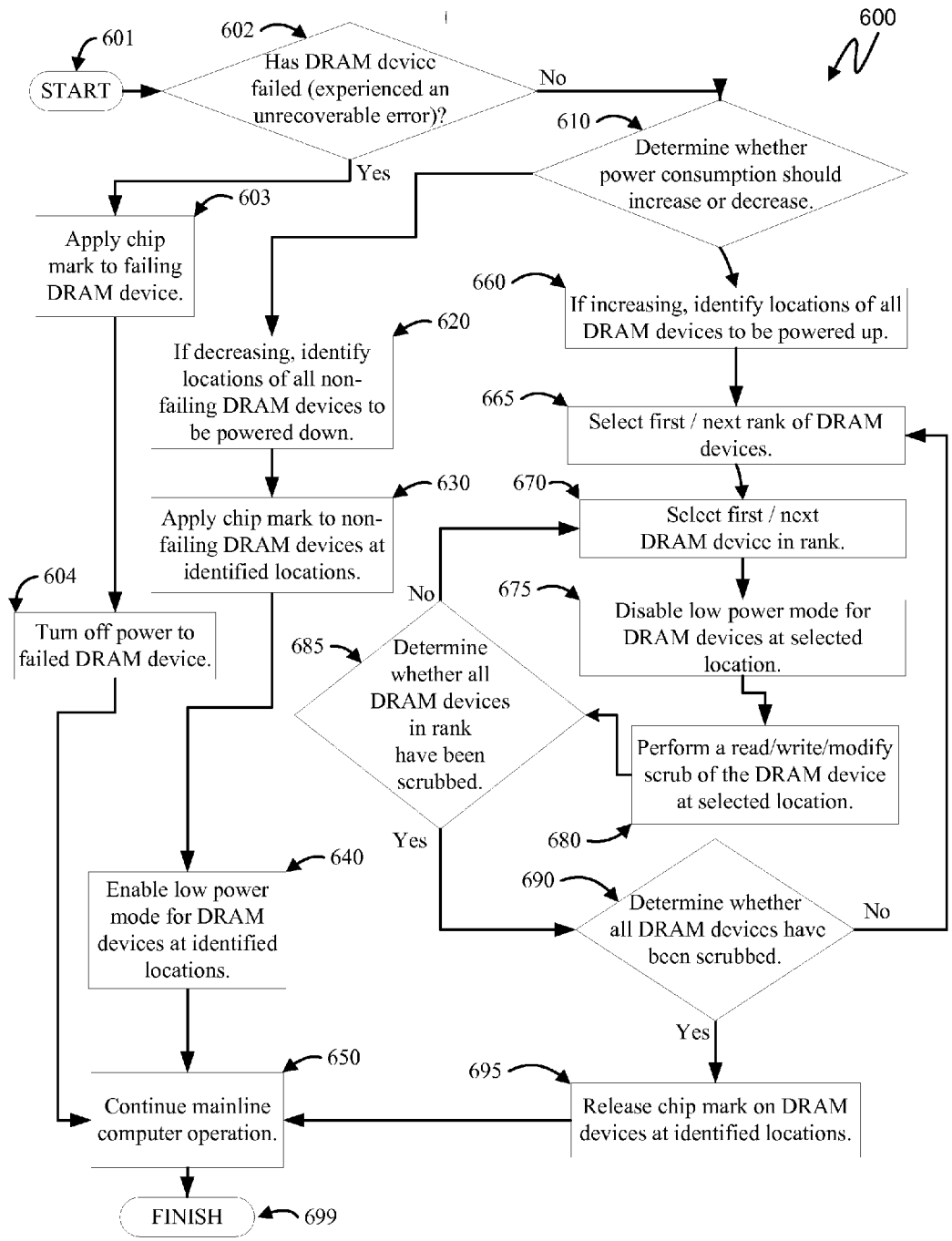
FIG. 6 shows a method of operating a computer memory system to enable and disable a mixed power consumption mode in the computer memory system, according to an embodiment.

FIG. 6 portrays a method 600 of operating a computer memory system in order to achieve embodiments of the mixed power consumption mode. A computer system or an operator of a computer system may determine whether a computer system may reduce power consumption 610. When mixed power consumption is to be reduced, the computer memory system may identify locations of all DRAM devices to be powered down 620. Computer memory system may then apply a chip mark to the DRAM devices at all identified locations 630. The computer memory system may enable low power mode on DRAM devices at identified locations 640 and continue mainline computer operation 650. When power consumption is to increase, the computer memory subsystem may identify locations of all DRAM devices to be powered up 660. Computer memory system may then select a rank having DRAM devices to be powered up 665 and select a DRAM device in the rank to be powered up 670. Computer memory subsystem may then disable low power mode for the DRAM device at the selected location 675. The computer memory system may then perform a read-write-modify scrub of the DRAM device at selected location 680. When the scrub is complete, the computer memory system may determine whether all DRAM devices in the rank have been scrubbed 685. When the answer is negative, the computer system may repeat the DRAM device location selection process 670, low power disablement step 675, and scrub step 680 until the answer is affirmative.

When the answer to step 685 is affirmative, the computer memory system may then determine whether all ranks having identified DRAM devices have been scrubbed 690. When the answer to step 690 is negative, the computer system may repeat the rank selection step 665, DRAM device selection step 670, the low power disablement step at a selected location 675, the scrub step at the selected location 680, and the step of determining whether all DRAM devices in the rank have been scrubbed 685. When the answer to step 690 is affirmative, the computer memory system may release the chip mark on DRAM devices at identified locations 695 and return to mainline computer operation 650.

Figure 7:
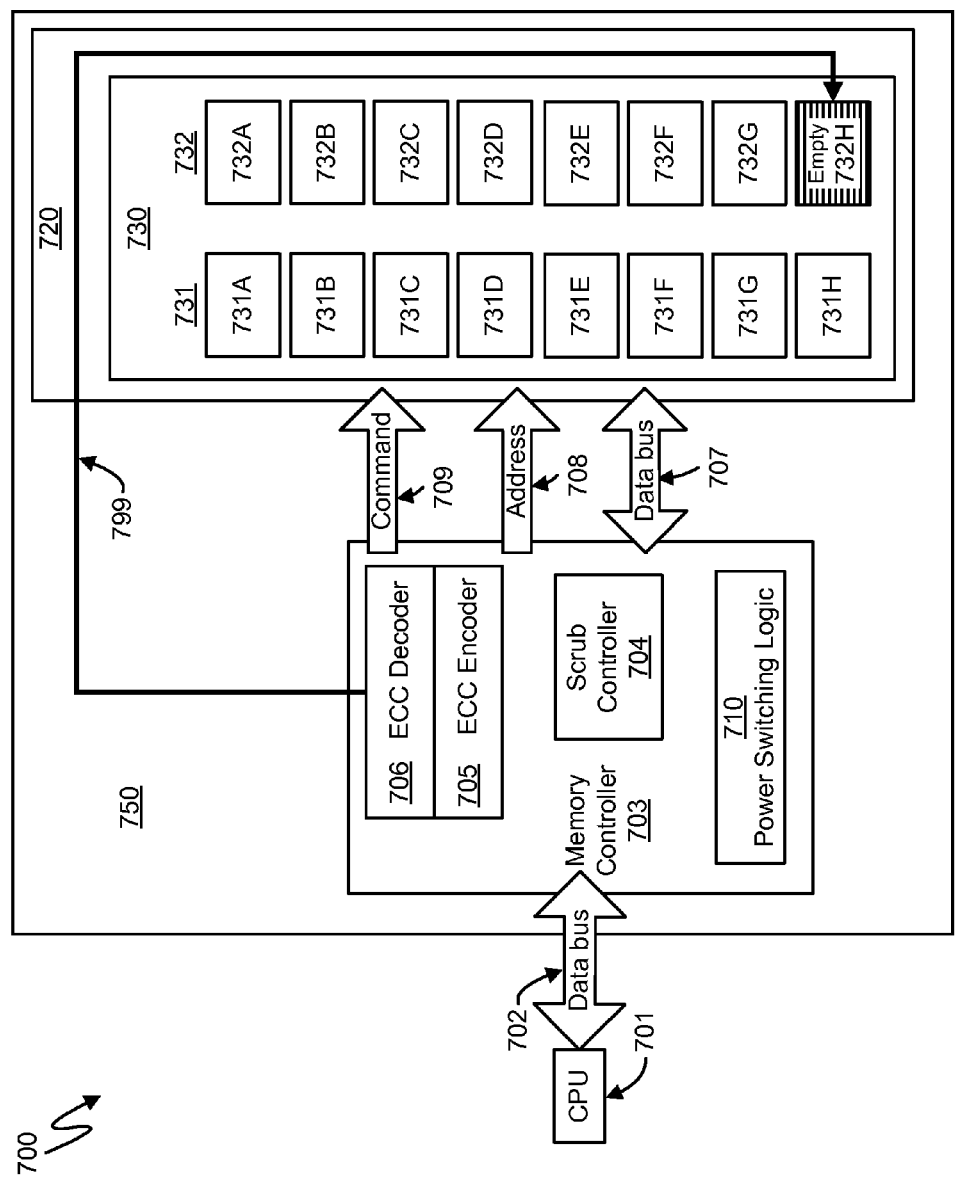
FIG. 7 portrays an embodiment of the present disclosure where a computer memory socket is vacant.

FIG. 7 portrays embodiments of the present disclosure that have been partially configured with computer memory, where some sockets for holding computer memory chips are left vacant or unpopulated. A computer system 700 contains a central processing unit 701 connected to a computer memory system 750 via a data bus 702. Computer memory system 750 contains a memory controller 703, which further contains an error correcting code (ECC) decoder 706, an ECC encoder 705, a scrub controller 704 and a power switching logic 710. Memory controller 703 is connected to a computer memory subsystem 720 via a command bus 709, an address bus 708 and a data bus 707. Computer memory subsystem 720 may contain a dual inline memory module (DIMM) 730 with ranks of computer memory in it. A first rank of computer memory 731 and a second rank of computer memory may populate the DIMM 730. The first rank 731 and the second rank 732 of computer memory may each be configured to hold up to eight memory arrays. The first rank 731 may be populated with eight memory arrays 731A through 731H. The second rank 732 may be populated with only seven memory arrays 732A through 732G. The eighth position in the second rank 732 of computer memory may be an empty position 732H.

During normal operation of embodiments similar to that disclosed herein, memory controller 703 may be configured to have ECC decoder 706 place a chip mark 799 to the empty position 732H in order to prevent computer memory system 750 from transmitting data to the empty position 732H. Unlike other embodiments of the present disclosure, embodiments with an empty position similar to 732H may operate permanently in a low power mode, not because power switching logic 710 may be instructed to transmit memory register set data and trigger chip mark placement, but because a memory array is missing from a rank of computer memory. Although other ranks of computer memory may operate in a low power mode or in a normal power mode, a rank of computer memory with empty position 732H may only operate in a low power mode while empty position 732H is unoccupied. Should the empty position 732H be populated in the future, normal power mode may become available.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments herein.

What is claimed is:

1. A computer memory system comprising:
a memory array with a plurality of dynamic random access memory (DRAM) devices;
an error correcting code decoder configured to:
  detect a data error in a first DRAM device of the memory array using an error correcting code;
  associate, in response to detecting the data error in the first DRAM device, a first chip mark with the first DRAM device;
  handle the data error in the first DRAM device; and
  associate, in response to a power saving instruction, a second chip mark with a non-failing second DRAM device in the memory array; and
a power switching logic configured to:
  select, in response to the power saving instruction, the non-failing second DRAM device in the memory array; and
  place, in response to associating the second chip mark with the non-failing second DRAM device, the non-failing second DRAM device in a low power mode;
  wherein data in the memory array may be read when less than two chip marks are associated with a DRAM device in the memory array.

2. The system of claim 1, wherein the error correcting code decoder is further configured to instruct the computer memory system to disable the first DRAM device following a data error.

3. The system of claim 1, wherein the error correcting code decoder is further configured to use error correcting code to correct the data error in the first DRAM device, and to release the first chip mark from the first memory array following the correction.

4. The system of claim 1, wherein the data in the second DRAM device is correct.

5. The system of claim 1, wherein the power switching logic is further configured to produce memory register set data to transition between a low power mode and a normal power mode.

6. The system of claim 1, wherein the computer memory system further comprises:
a command decoder, configured to receive memory register set data that transitions the computer memory between a low power mode and a normal power mode.

* * * * *